US 12,381,492 B2

(12) United States Patent
Shimomura et al.

(10) Patent No.: US 12,381,492 B2
(45) Date of Patent: Aug. 5, 2025

(54) VIBRATION-DRIVEN ENERGY HARVESTING ELEMENT AND METHOD FOR MANUFACTURING THE SAME

(71) Applicant: SAGINOMIYA SEISAKUSHO, INC., Tokyo (JP)

(72) Inventors: Noriko Shimomura, Sayama (JP); Hisayuki Ashizawa, Sayama (JP)

(73) Assignee: Saginomiya Seisakusho, Inc., Tokyo (JP)

( * ) Notice: Subject to any disclaimer, the term of this patent is extended or adjusted under 35 U.S.C. 154(b) by 195 days.

(21) Appl. No.: 18/266,995

(22) PCT Filed: Nov. 1, 2021

(86) PCT No.: PCT/JP2021/040312
§ 371 (c)(1),
(2) Date: Jun. 13, 2023

(87) PCT Pub. No.: WO2022/130809
PCT Pub. Date: Jun. 23, 2022

(65) Prior Publication Data
US 2024/0088802 A1    Mar. 14, 2024

(30) Foreign Application Priority Data

Dec. 17, 2020   (JP) ................................. 2020-209684

(51) Int. Cl.
*H02N 1/06*   (2006.01)
*B81B 3/00*   (2006.01)
*H02N 1/00*   (2006.01)

(52) U.S. Cl.
CPC .................................... *H02N 1/06* (2013.01)

(58) Field of Classification Search
CPC ............ H02N 1/06; H02N 1/00; H02N 1/008; H02N 1/002; B81B 3/0003; B81B 3/0013;
(Continued)

(56) References Cited

U.S. PATENT DOCUMENTS 6,393,913 B1 *   5/2002  Dyck ..................... G01P 15/097
333/186
7,444,873 B2 *  11/2008  Robert ................ G01P 15/0802
73/514.32
(Continued)

FOREIGN PATENT DOCUMENTS

JP       2020114150 A     7/2020
WO    WO2020153362    *   7/2020  ............... H02N 1/08

OTHER PUBLICATIONS

International Preliminary Report on Patentability, PCT/JP2021/040312, Jun. 13, 2023.
International Search Report, PCT/JP2021/040312, Dec. 28, 2021.

*Primary Examiner* — Burton S Mullins
(74) *Attorney, Agent, or Firm* — The Webb Law Firm (57) ABSTRACT

A vibration-driven energy harvesting element includes fixed electrodes that are fixed to a base part, a movable electrode that is movable with respect to the fixed electrodes, and an elastic support part that includes one end fixed to the base part and another end fixed to the movable electrode and elastically supports the movable electrode. The elastic support part of the vibration-driven energy harvesting element includes a plurality of elastic structures each of which has a linking portion, a first elastic portion, and a second elastic portion. The first elastic portion having one end fixed to the linking portion and another end fixed to the movable electrode and extending in a second direction orthogonal to a first direction in which the movable electrode vibrates. The second elastic portion having one end fixed to the linking portion and another end fixed to the base part and extending in the second direction. The plurality of elastic structures being disposed on both sides of the movable electrode in the first direction; and connecting members that connect the linking portions included in the plurality of elastic structures to each other.

9 Claims, 4 Drawing Sheets

(58) Field of Classification Search
CPC .......... B81B 3/0016; B81B 2203/0163; B81B 2203/0136
USPC ............. 310/309; 73/504.12, 504.14, 514.32
See application file for complete search history.

(56) References Cited

U.S. PATENT DOCUMENTS

| | | | | |
|---|---|---|---|---|
| 8,410,658 B2* | 4/2013 | Zhang | .................. | B81B 3/0021 |
| | | | | 310/309 |
| 8,866,363 B2* | 10/2014 | Masunaga | ............ | B81B 3/0072 |
| | | | | 310/40 MM |
| 9,036,230 B1* | 5/2015 | Lin | .................... | G02B 26/0841 |
| | | | | 359/199.2 |
| 2014/0245832 A1* | 9/2014 | Lin | ....................... | G01P 15/125 |
| | | | | 73/514.35 |
| 2018/0087491 A1* | 3/2018 | Zhang | .................. | G01P 15/125 |
| 2022/0131478 A1 | 4/2022 | Ashizawa | | |

* cited by examiner

A-A SECTIONAL VIEW

VIBRATION-DRIVEN ENERGY HARVESTING ELEMENT AND METHOD FOR MANUFACTURING THE SAME

CROSS-REFERENCE TO RELATED APPLICATIONS

This application is the United States national phase of International Application No. PCT/JP2021/040312 filed Nov. 1, 2021, and claims priority to Japanese Patent Application No. 2020-209684 filed Dec. 17, 2020, the disclosures of which are hereby incorporated by reference in their entireties.

BACKGROUND OF THE INVENTION

Field of the Invention

The present invention relates to a vibration-driven energy harvesting element and a method for manufacturing the vibration-driven energy harvesting element.

Description of Related Art

As one of energy harvesting techniques for collecting energy from ambient vibration, there is a known technique for generating electricity from ambient vibration with a vibration-driven energy harvesting element that is a micro electro mechanical systems (MEMS) vibration element.

In a vibration-driven energy harvesting element, a movable electrode is supported by an elastic support part like a cantilever, and the movable electrode vibrates with respect to fixed electrodes to generate electricity (see Patent Literature 1).

CITATION LIST

Patent Literature

Patent Literature 1: Japanese Patent Laid-Open No. 2020-114150

SUMMARY OF INVENTION

Technical Problem

In a conventional vibration-driven energy harvesting element, when an electrification voltage of electrets is increased to increase the amount of electricity generation, an influence of electrostatic force that acts between its movable electrode and its fixed electrodes grows, which tends to cause a strain to occur in an elastic support part supporting the movable electrode. When the strain in the elastic support part increases, the movable electrode sticks to the fixed electrodes, disabling the electricity generation.

Solution to Problem

A vibration-driven energy harvesting element according to a first aspect of the present invention is a vibration-driven energy harvesting element including fixed electrodes that are fixed to a base part, a movable electrode that is movable with respect to the fixed electrodes, and an elastic support part that includes one end fixed to the base part and another end fixed to the movable electrode and elastically supports the movable electrode, wherein the elastic support part includes: a plurality of elastic structures each of which has a linking portion, a first elastic portion, and a second elastic portion, the first elastic portion having one end fixed to the linking portion and another end fixed to the movable electrode and extending in a second direction orthogonal to a first direction in which the movable electrode vibrates, the second elastic portion having one end fixed to the linking portion and another end fixed to the base part and extending in the second direction, the plurality of elastic structures being disposed on both sides of the movable electrode in the first direction; and connecting members that connect the linking portions included in the plurality of elastic structures to each other.

A method for manufacturing a vibration-driven energy harvesting element according to a second aspect of the present invention is a method for manufacturing the vibration-driven energy harvesting element according to the first aspect, the method including: a first process of preparing a substrate provided with a first layer, a second layer, and a third layer; a second process of partly etching the first layer from the first layer side of the substrate to form the fixed electrodes, the movable electrode, and the elastic support part excluding the connecting members; a third process of partly etching the third layer from the third layer side of the substrate to form the base part and the connecting members; and a fourth process of, after the second process and the third process are ended, partly etching the second layer to separate at least the fixed electrodes from the connecting members.

Advantageous Effects of Invention

According to the present invention, for an elastic support part of a MEMS vibration-driven energy harvesting element, a strain caused by electrostatic force between electrodes can be reduced.

DESCRIPTION OF EMBODIMENTS

An embodiment for carrying out the present invention will be described below with reference to the drawings.

Figure 1:
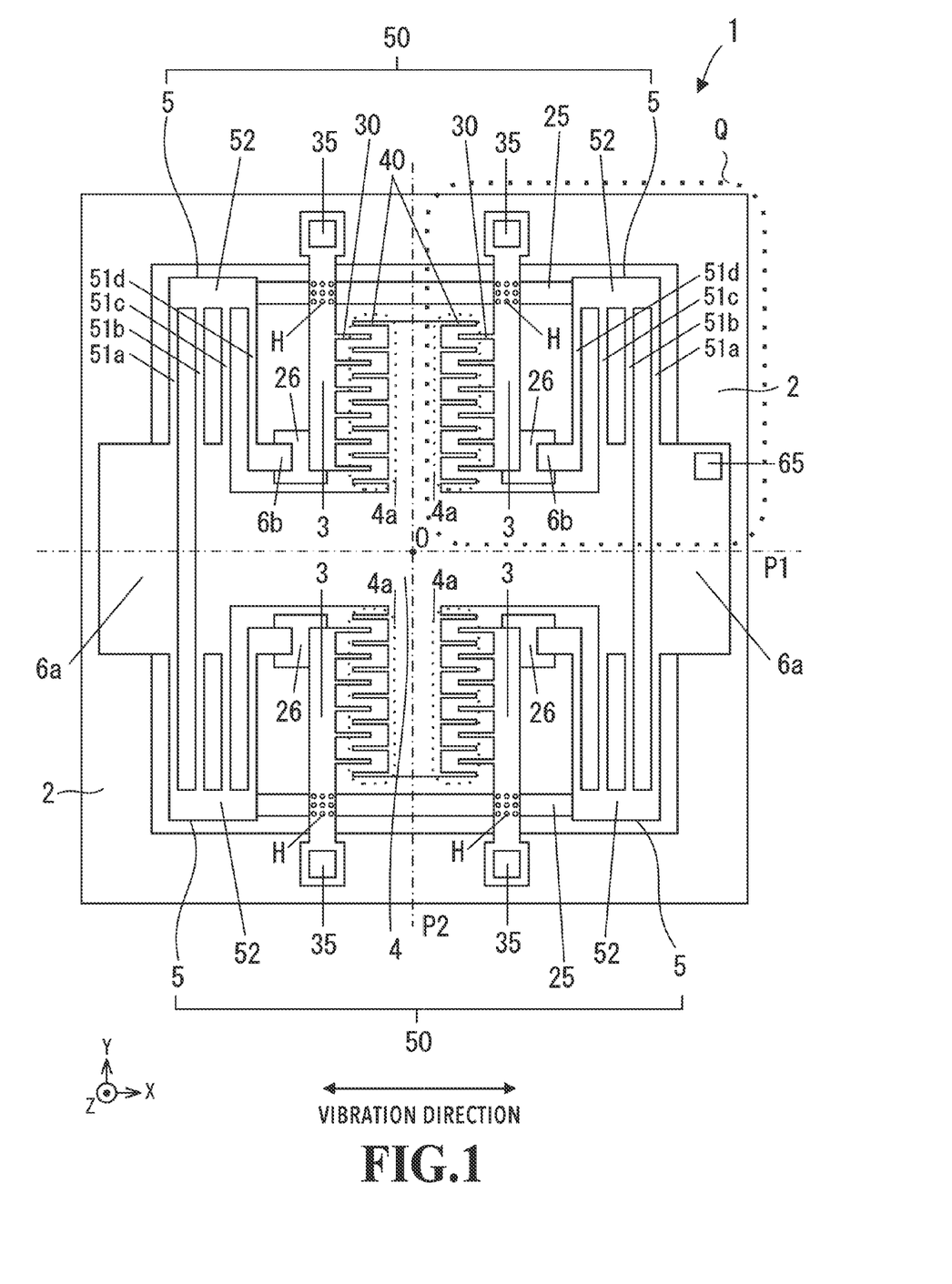
FIG. 1 is a plan view illustrating an example of a vibration-driven energy harvesting element.

FIG. 1 is a plan view illustrating an example of a vibration-driven energy harvesting element 1. In FIG. 1 and some of the subsequent drawings, a right-handed orthogonal coordinate system called a Cartesian coordinate system is used to express directions of an X direction, a Y direction, and a Z direction. The X direction, the Y direction, and the Z direction are directions orthogonal to one another, the X direction and the Y direction are directions parallel to a plane in which a movable electrode to be described later in detail vibrates in electricity generation, and the Z direction is a direction orthogonal to the plane of the vibration.

The vibration-driven energy harvesting element 1 is made of Si and is formed from, for example, a silicon on insulator (all) substrate by a typical MEMS processing technique. The vibration-driven energy harvesting element 1 according to the present embodiment is a minute electricity generating device with side length of about 10 to several 10 mm. Such an electricity generating device is used in an application in which, for example, the electricity generating device generates electricity from mechanical vibration (ambient vibration) of a compressor or the like operating in a factory to supply electricity to a sensor, a wireless terminal, and the like for monitoring.

As will be described later with reference to FIG. 4(a), the SOI substrate used in the present embodiment is a substrate having a three-layered structure in which a support layer being a lower layer and made of Si, a sacrificial layer being an intermediate layer and made of $SiO_2$, and an active layer being an upper layer and made of Si are stacked in the Z direction.

Note that the vibration-driven energy harvesting element 1 is not limited to an SOI substrate and may be formed from a Si substrate or the like.

Referring to FIG. 1, the vibration-driven energy harvesting element 1 includes a base part 2, four fixed electrodes 3 that are fixed to the base part 2 and to regions 26 formed on the support layer as with the base part 2, a movable electrode 4 that is provided corresponding to the fixed electrodes 3, four elastic structures 5 that elastically support the movable electrode 4, and two fixing parts 6a that are fixed on the base part 2 and support the four elastic structures 5. In FIG. 1, the support layer is provided in the lower layer of the SOI substrate, and the base part 2 is formed in the support layer. The four fixed electrodes 3, the movable electrode 4, the four elastic structures 5, and the two fixing parts 6a are all formed in the active layer being the upper layer.

The movable electrode 4 is connected to the two fixing parts 6a, at the right and left ends of the illustration, via the four elastic structures 5. The fixed electrodes 3 are each provided with an electrode pad 35, and the fixing part 6a on the right side of the illustration is provided with an electrode pad 65.

(Fixed Electrodes and Movable Electrode)

The four fixed electrodes 3 each have a comblike structure including a plurality of fixed teeth 30 that extend in the X direction and are arranged in the Y direction. The movable electrode 4 has four movable tooth groups 4a that correspond to the four fixed electrodes 3. The four movable tooth groups 4a each have a comblike structure including a plurality of movable teeth 40 that extend in the X direction and are arranged in the Y direction. The plurality of fixed teeth 30 formed in the fixed electrodes 3 and the plurality of movable teeth 40 of the movable tooth groups 4a corresponding to the fixed electrodes 3 are disposed in such a manner that the fixed teeth 30 and the movable teeth 40 mesh with each other by a prescribed depth of mesh in the X direction with prescribed gaps in the Y direction in a stationary state (neutral state).

(Elastic Support Part)

An elastic support part 50 is constituted by the four elastic structures 5. A portion of the movable electrode 4 on the right side of the illustration is supported by two right-side elastic structures 5 of the four elastic structures 5, and a portion of the movable electrode 4 on the left side of the illustration is supported by two left-side elastic structures 5 of the four elastic structures 5.

The elastic structures 5 each include four MEMS elastic structures including MEMS elastic structures 51b and 51c as first elastic portions and MEMS elastic structures 51a and 51d as second elastic portions. The four MEMS elastic structures 51a to 51d provided in each of the elastic structures 5 are connected (fixed) to a coupling portion 52 included in the elastic structure 5.

For example, in the case of four MEMS elastic structures 51a to 51d provided in the elastic structure 5 at the top left of the illustration, two MEMS elastic structures 51b and 51c disposed inward are fixed to the movable electrode 4 on the bottom side of the illustration and fixed to the coupling portion 52 on the top side of the illustration.

The MEMS elastic structure 51a disposed at the left end of the four MEMS elastic structures 51 is fixed, on the bottom side of the illustration, to the fixing part 6a being on the left side of the illustration and being fixed on the base part 2 and is fixed, on the top side of the illustration, to the coupling portion 52.

The MEMS elastic structure 51d disposed at the right end of the four MEMS elastic structures 51 is fixed, on the bottom side of the illustration, to a fixing part 6b at the top left of the illustration being fixed to the region 26 formed on the support layer as with the base part 2 and is fixed, on the top side of the illustration, to the coupling portion 52.

The elastic structure 5 including the four MEMS elastic structures 51a to 51d fixed in this manner functions as a spring. That is, the movable electrode 4 supported via the elastic structures 5 changes its position in the X direction with respect to the coupling portion 52 that is fixed with the two MEMS elastic structures 51b and 51c disposed inward of the four MEMS elastic structures 51a to 51d, while the coupling portion 52 changes its position in the X direction with respect to the base part 2 (region 26) that is fixed with the two MEMS elastic structures 51a and 51d at the right and left ends of the illustration of the four MEMS elastic structures 51a to 51d.

The four MEMS elastic structures 51a to 51d included in each of the elastic structures 5 at the top right, bottom left, and bottom right of the illustration have the same structure as the structure of the four MEMS elastic structures 51a to 51d included in the elastic structure 5 at the top left of the illustration.

Electrets are formed on at least either of the fixed teeth 30 or the movable teeth 40. When the movable electrode 4 vibrates, the depth of mesh between the fixed teeth 30 and the movable teeth 40 changes, causing electricity generation.

Electrets may be formed on all of the fixed teeth 30 and the movable teeth 40. The movable electrode 4 herein refers to a member that is held by the elastic structures 5 and vibrates in a vibration direction (X direction) integrally with the movable teeth 40 by deformation of the elastic structures 5.

The movable electrode 4 and the base part 2 constitute a spring-mass resonance system with the elastic structures 5 that function as springs as described above. When vibration is added from the outside to the vibration-driven energy harvesting element 1, the MEMS elastic structures 51a to 51d of the elastic structures 5 deform by resonance (in the case where the vibration is a sine wave vibration) and a transient response (in the case where the vibration is an impulse vibration), which causes the movable electrode 4 to vibrate in the X direction. When the movable teeth 40 vibrate with respect to the fixed teeth 30, an induced current is generated, which is extracted to the outside through the electrode pads 35 and 65. In this manner, the vibration-driven energy harvesting element 1 is used as an electricity generating device.

In the vibration-driven energy harvesting element 1 according to the present embodiment, for example, electret films are formed on surfaces of the fixed teeth 30 of the fixed electrodes 3 by a known electret formation processing. The electret films are SiO$_2$ films on the surfaces of the fixed teeth 30 each of which is changed into a state of having an electric double layer. Portions of a Si substrate of the fixed teeth 30 on which the electret films are formed assume positive charges, and the SiO$_2$ films assume negative charges in the vicinities of interfaces between the SiO$_2$ film and the Si substrate.

(Electrification Voltage)

In the present embodiment, in the course of the electret formation processing, a direct current voltage V0 is applied between the movable electrode 4 and the fixed electrodes 3 from the outside. In this case, the voltage V0 that brings an electric field of the gap in the Y direction described above between the movable teeth 40 and the fixed teeth 30 to zero is defined as an electrification voltage. That is, a potential difference across the electric double layer matches the electrification voltage and is equal to the voltage V0 that is applied from an external power source in the electret formation processing.

(Pull-In Effect)

In the vibration-driven energy harvesting element 1 illustrated, a direction in which the movable electrode 4 vibrates in the electricity generation is the X direction. The amount of the electricity generation by the vibration-driven energy harvesting element 1 can be increased with an increase in the electrification voltage. At the same time, with the increase in the electrification voltage, electrostatic attraction that causes the electrodes to attract each other is produced between the movable teeth 40 and the fixed teeth 30. As described above, the fixed teeth 30 and the movable teeth 40 corresponding to the fixed teeth 30 that are mesh with each other provide the prescribed gaps in the Y direction in the stationary state (neutral state). The Y direction is a direction orthogonal to the vibration direction (X direction) in the plane in which the movable electrode 4 vibrates in the electricity generation.

If the electrostatic attraction is too strong, the movable teeth 40 stick to the fixed teeth 30 to interfere with the vibration of the movable electrode 4, disabling the electricity generation. Such a phenomenon is called a pull-in effect, and such an electrification voltage that causes the pull-in effect is called a pull-in voltage Vp.

To avoid the sticking of the movable teeth 40 to the fixed teeth 30 by resisting the electrostatic attraction between the movable teeth 40 and the fixed teeth 30 described above, it is desirable to increase a repulsive force in the Y direction of the elastic structures 5 each having the MEMS elastic structures 51a to 51d, in other words, to increase a spring constant of the elastic structures 5 in the Y direction. For that reason, in the present embodiment, connecting members 25 as reinforcing members are fixed to the coupling portions 52 of the elastic structures 5 so as to reduce a strain that occurs in each coupling portion 52 to which the four MEMS elastic structures 51a to 51d are connected in the elastic structure 5. One of the connecting members 25 connects (fixes) the coupling portion 52 of two right and left elastic structures 5 disposed on an upper side of the illustration to each other. In addition, the other connecting member 25 is fixed to two right and left elastic structures 5 disposed on a lower side of the illustration to connect (fix) two right and left coupling portions 52 on the lower side of the illustration to each other.

(Connecting Member)

Figure 2:
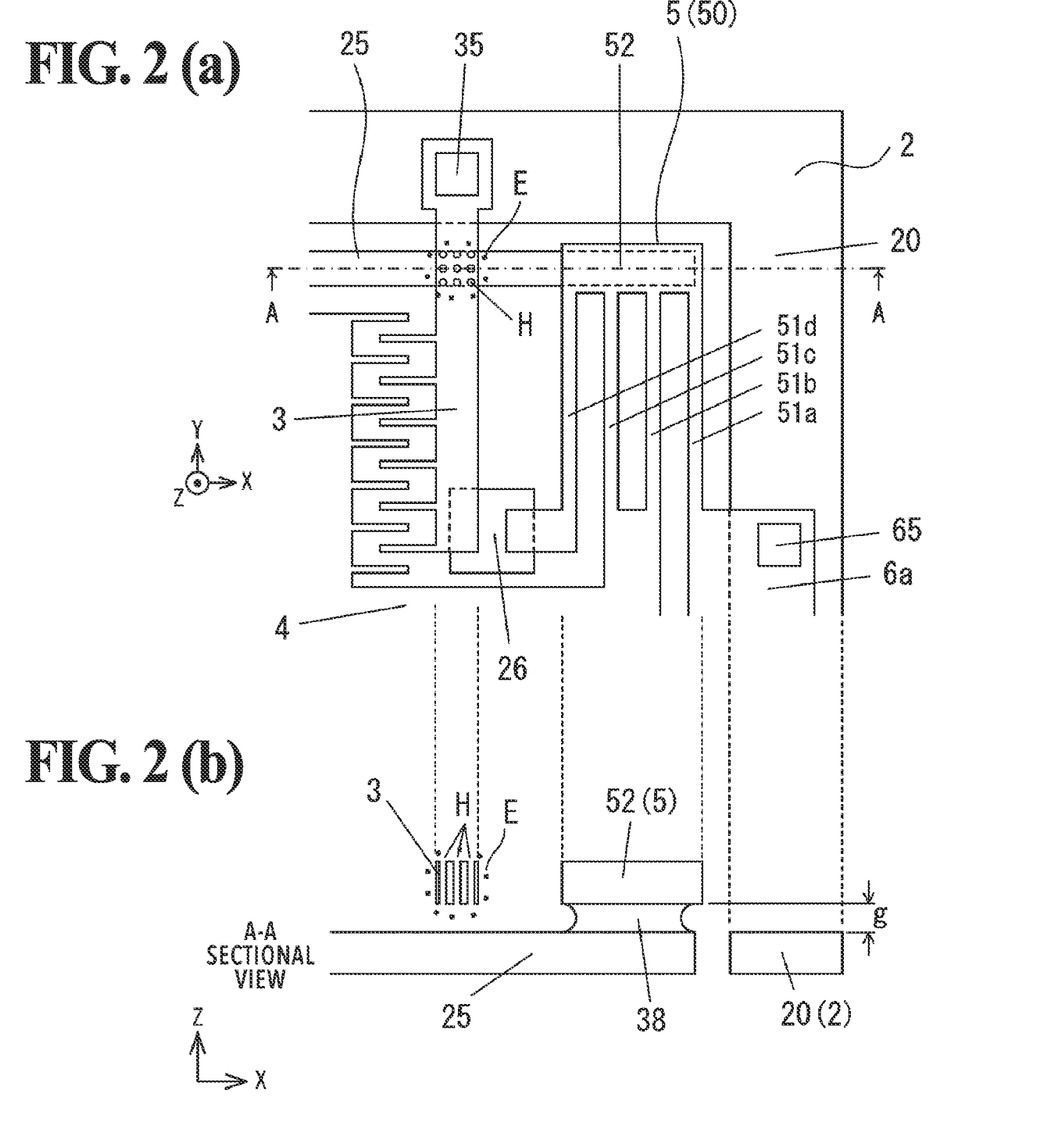
FIG. 2(a) is a diagram of an area enclosed with a broken line Q in FIG. 1, illustrating the area in an enlarged manner.
FIG. 2(b) is a schematic diagram of a section along line A-A in FIG. 2(a), as viewed in a positive direction from a negative position in the Y direction.

The connecting members 25 will be described in detail. FIG. 2(*a*) is a diagram of an area enclosed with a broken line Q in FIG. 1, illustrating the area in an enlarged manner. FIG. 2(*b*) is a schematic diagram of a section along line A-A in FIG. 2(*a*), as viewed in a positive direction from a negative position in the Y direction. The chain line A-A is a straight line that is parallel to an X-axis and passes through the connecting member 25.

In FIG. 2(*a*) and FIG. 2(*b*), the connecting member 25, the base part 2, and the region 26 are formed in the support layer. The elastic structures 5, the fixed electrodes 3, and the movable electrode 4 are formed in the active layer. One of the connecting members 25 mechanically connects the coupling portion 52 of the two right and left elastic structures 5 disposed on the upper side of the illustration in FIG. 1 to each other.

A region of the coupling portion 52 of the elastic structure 5 that overlaps the connecting member 25 in top view (i.e., as viewed in the Z direction) is mechanically fixed to the connecting member 25 via a sacrificial layer 38 from a negative Z direction.

A region of the connecting member 25 in which the connecting member 25 and the fixed electrode 3 intersect with each other in top view (a portion E enclosed with a broken line) is spaced by a clearance g in the Z direction. The clearance g in the Z direction between the fixed electrode 3 and the connecting member 25 is about 1 to 5 μm, which is equivalent to a thickness of the sacrificial layer.

In such a configuration, the two right and left elastic structures 5 connected to each other with the connecting member 25 are both reinforced by the connecting member 25, so that a strain that occurs in each coupling portion 52 is reduced.

The portion E of the fixed electrode 3 is provided with a plurality of holes H for etching that penetrate through the fixed electrode 3 in the Z direction. The holes H are also referred to as release holes. The number and the shape of the release holes need not be the number and the circular shape as illustrated. The shape may be an elliptical shape or a rectangular shape.

The same connecting member as the connecting member 25 described above is provided at a position linear symmetric with the position of the connecting member 25 with respect to a straight line P1 that passes a gravity center O of the movable electrode 4 in the vibration-driven energy harvesting element 1 and is parallel to the X-axis. That is, also on the coupling portions 52 of the two right and left elastic structures 5 disposed on the lower side of the illustration in FIG. 1, the connecting member 25 that connects the two coupling portions 52 to each other is provided.

(Spring Constant in Y Direction)

A spring constant ky in the Y direction of the elastic structures 5 of the vibration-driven energy harvesting element 1 that are con FIG. d as described above is exemplified as follows.

$$ky = 5\ \text{N}/10\ \mu\text{m} = 500\ \text{kN/m} \tag{1}$$

For comparison purposes, a spring constant ky(p) in the Y direction of the elastic structures 5 without the connecting members 25 is exemplified as follows.

$$ky(p) = 5\ \text{N}/13\ \mu\text{m} = 384\ \text{kN/m} \tag{2}$$

Providing the connecting members 25 can make the spring constant ky in the Y direction of the elastic structures 5 higher by about 30 percent than the spring constant in the case where the connecting members 25 are not provided.

(Pull-In Voltage)

In general, the pull-in voltage Vp that causes the pull-in effect in the vibration-driven energy harvesting element 1, that is, the electrification voltage that causes the pull-in effect is given by Equation (3) shown below.

$$Vp = \sqrt{(ky \times \alpha)} \tag{3}$$

where ky denotes a spring constant in the Y direction of the elastic structures 5, and α denotes a constant determined depending on dimensions of the teeth (the fixed teeth 30 and the movable teeth 40).

As is clear from Equation (3) above, the pull-in voltage Vp increases in proportion to √(ky). Therefore, increasing the spring constant ky in the Y direction of the elastic structures 5 leads to an increase in the pull-in voltage Vp. When the spring constant ky of Equation (1) is substituted into Equation (3), the pull-in voltage Vp is exemplified as about 714 V. For comparison purposes, when the spring constant ky(p) of Equation (2) is substituted into Equation (3), the pull-in voltage Vp is exemplified as about 625 V.

In general, to prevent the pull-in effect from occurring in the vibration-driven energy harvesting element 1, the electrification voltage is set to be lower than the pull-in voltage Vp. By a known electret formation processing (e.g., the formation processing described in Japanese Patent Laid-Open No. 2014-50196), the electret films are produced on the surfaces of the fixed teeth 30 of the fixed electrodes 3.

Specifically, for example, the electret films are produced such that an electrification voltage of 714/2=357 V is given, with a factor of safety set to 2. In other words, in the course of the electret formation processing, the direct current voltage V0=357 V is applied between the movable electrode 4 and the fixed electrodes 3 from the outside.

(Method for Producing Vibration-Driven Energy Harvesting Element)

Figure 3:
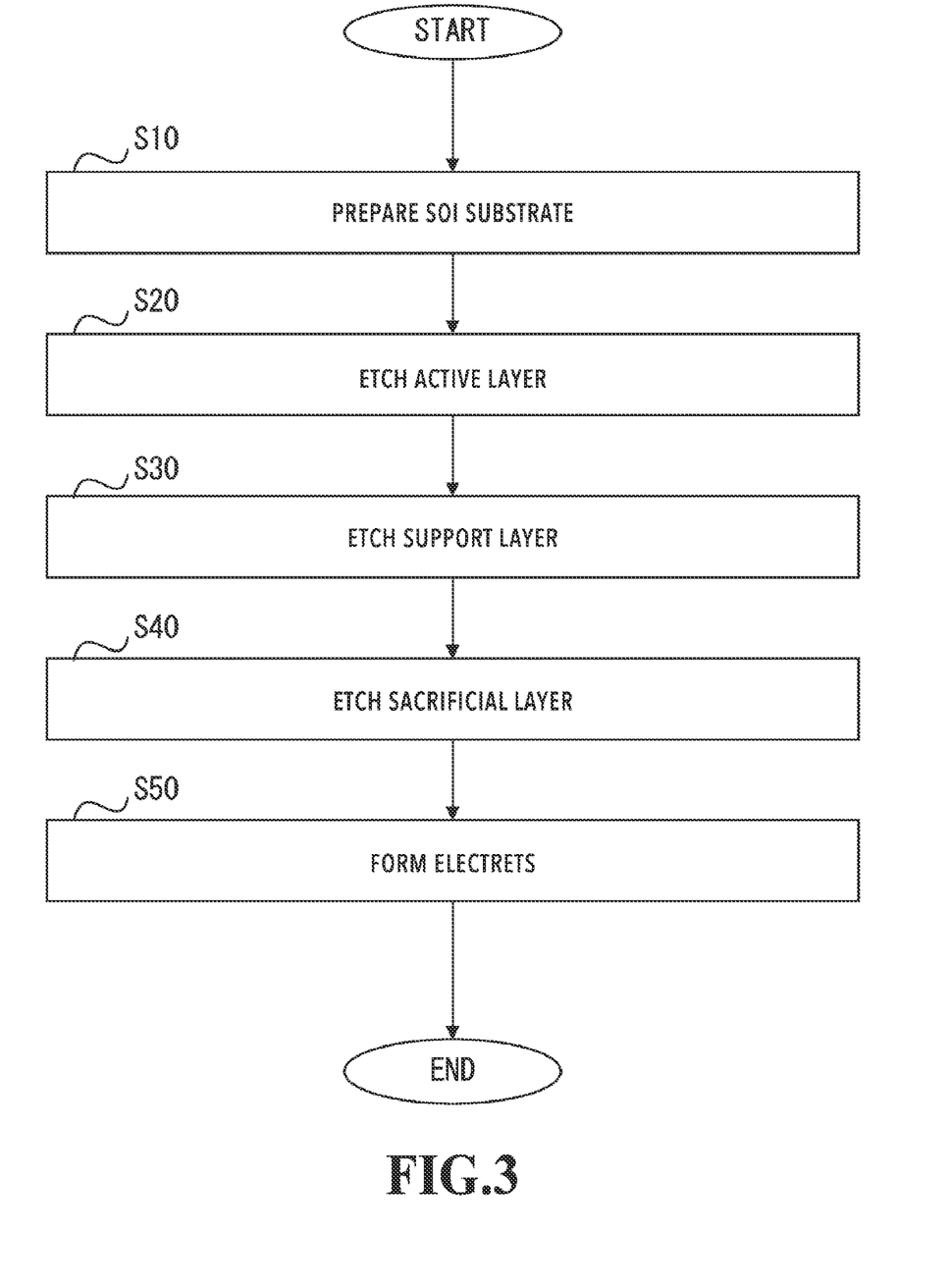
FIG. 3 is a flowchart illustrating a procedure for manufacturing the vibration-driven energy harvesting element.
Figure 4:
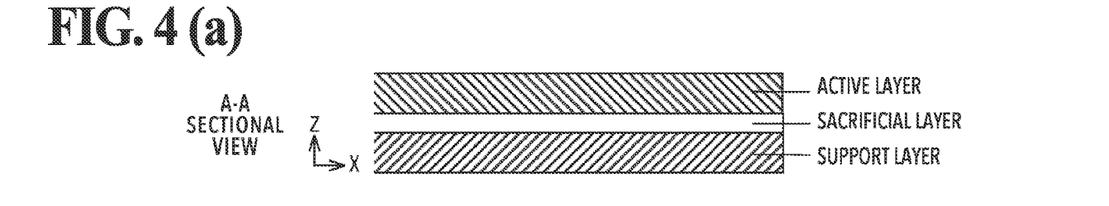
FIG. 4(a) to FIG. 4(d) are schematic diagrams each illustrating a product in a production stage.

An example of a method for manufacturing the vibration-driven energy harvesting element 1 will be described below with reference to FIG. 3 and FIG. 4. FIG. 3 is a flowchart illustrating a procedure for manufacturing the vibration-driven energy harvesting element 1. FIG. 4(*a*) to FIG. 4(*d*) are schematic diagrams each illustrating a product in a production stage. FIG. 4(*a*) to FIG. 4(*d*) each correspond to an area illustrated in the sectional view along line A-A, which is illustrated in FIG. 2(*b*), and sections of the active layer and the support layer are hatched to be distinguishable.

(Process 1)

In step S10 in FIG. 3, an operator or a production apparatus prepares an SOI substrate illustrated in FIG. 4(*a*).

(Process 2)

In step S20 in FIG. 3, the operator or the production apparatus performs etching by reactive ion etching (RIE) using a gas containing fluorine such as SF6 or CF4 on the active layer being the upper layer of the SOI substrate to form a pattern of the coupling portion 52 of the elastic structure 5, the fixed electrode 3, and the like within an area illustrated in FIG. 4(*b*) and to form a pattern of the fixed electrodes 3, the movable electrode 4, the elastic structures 5, the fixing parts 6*a*, and the like within an area not illustrated in FIG. 4(*b*).

Specifically, resist not illustrated is formed on the entire active layer and the resist is partly removed to form openings. The openings include the openings of the holes H for etching (release holes). The resist is removed in, for example, a photolithography process that includes exposure, development, and the like.

Then, the active layer is etched with the remaining resist used as an etching mask to form a pattern that penetrates through the active layer in the Z direction as illustrated in FIG. 4(*b*). The remaining resist and the like are then removed by sulfuric acid peroxide mixture (SPM) cleaning.

Although the present embodiment is described with an example in which the dry etching is adopted in Process 2, wet etching may be adopted in Process 2.

(Process 3)

In step S30, the operator or the production apparatus performs etching by the RIE on the support layer being the lower layer of the SOI substrate as in Step S20 to form a pattern of a region 20 of the base part 2 and the connecting member 25, and the like within an area illustrated in FIG. 4(*c*) and to form a pattern of regions 20 of the base part 2, the regions 26, and the like in an area not illustrated in FIG. 4(*c*).

Specifically, resist not illustrated is formed on the entire support layer and the resist is partly removed to form openings. The resist is removed in the photolithography process as with the active layer.

Then, the support layer is etched with the remaining resist used as an etching mask to form a pattern that penetrates through the support layer in the Z direction as illustrated in FIG. 4(*c*). The remaining resist and the like are then removed by the SPM cleaning.

Although the present embodiment is described with an example in which the dry etching is adopted in Process 3, wet etching may be adopted in Process 3.

(Process 4)

In step S40, the operator or the production apparatus removes the sacrificial layer being the intermediate layer of the SOI substrate by wet etching using buffered hydrogen fluoride (BHF). By the BHF, and above-described Process 2 and Process 3, the sacrificial layer in regions where at least one of the upper side (active layer side) and the lower side (support layer side) of the sacrificial layer is exposed is etched, and only the active layer or the support layer is left as illustrated in FIG. 4(*d*). After Process 2 and Process 3 described above, the sacrificial layer in regions where neither the upper side (active layer side) nor the lower side (support layer side) of the sacrificial layer is exposed are left after the wet etching to maintain a state of mechanically fixing the active layer and the support layer (the sacrificial layer 38).

Here, although neither the upper side (active layer side) nor the lower side (support layer side) of the sacrificial layer is exposed after Process 2 and Process 3 in a region where the holes H for etching (release holes) are provided in the active layer being the upper layer, a portion of the sacrificial layer corresponding to the region is etched via the release holes. In the present embodiment, a portion of the sacrificial layer and the like corresponding to the portion E is etched via the release holes. By such an etching technique, a region of the fixed electrode 3 corresponding to the portion E is separated from the connecting member 25, and also in the areas not illustrated, the fixed electrodes 3 are separated from the connecting members 25.

Although the present embodiment is described with an example in which the wet etching is adopted in Process 4, dry etching may be adopted in Process 4.

(Process 5)

By the procedure exemplified as Process 1 to Process 4 described above, a MEMS processed body of the vibration-driven energy harvesting element 1 in which the electrets have not been formed is formed. In step S50 as Process 5, the operator or the production apparatus forms the electrets on the fixed electrodes 3 and/or movable electrode 4 by the known electret formation processing.

By Process 1 to Process 5 described above, the vibration-driven energy harvesting element 1 is produced.

According to the embodiment described above, the following actions and effects can be provided.

(1) A vibration-driven energy harvesting element 1 includes fixed electrodes 3 fixed to a base part 2, a movable electrode 4 movable with respect to the fixed electrodes 3, and an elastic support part 50 that includes one end fixed to the base part 2 and the other end fixed to the movable electrode 4 and elastically supports the movable electrode 4. The elastic support part 50 includes: a plurality of elastic structures 5 each of which has a coupling portion 52, MEMS elastic structures 51b and 51c as first elastic portions each having one end fixed to the coupling portion 52 and the other end fixed to the movable electrode 4 and extending in a Y direction orthogonal to an X direction in which the movable electrode 4 vibrates, and has MEMS elastic structures 51a and 51d as second elastic portions each having one end fixed to the coupling portion 52 and the other end fixed to the base part 2 (a region 26) and extending in the Y direction, the plurality of elastic structures 5 being disposed on both sides of the movable electrode 4 in the X direction; and connecting members 25 that connect the coupling portions 52 included in the plurality of elastic structures 5 to each other.

With such a configuration, in a situation in which sticking of the movable teeth 40 to the fixed teeth 30 by resisting the electrostatic attraction between the movable teeth 40 and the fixed teeth 30 should be avoided, a strain that occurs in the coupling portion 52 to which the plurality of MEMS elastic structures 51a to 51d of each elastic structure 5 are fixed is reduced as compared with the case where the connecting members 25 are not provided. As a result, the spring constant ky in the Y direction of the elastic structures 5 is increased, so that stronger electrostatic attraction can be resisted. In other words, the pull-in voltage Vp of the vibration-driven energy harvesting element 1 can be increased. Accordingly, the amount of electricity generation by the vibration-driven energy harvesting element 1 can be increased.

(2) In the vibration-driven energy harvesting element 1 in above (1), the connecting members 25 and the fixed electrodes 3 intersect with each other as viewed from a Z direction orthogonal to the X direction and the Y direction and are separated from each other in the Z direction.

In such a configuration, the connecting members 25 can be provided in such a manner as not to come into contact with the movable electrode 4 vibrating in the electricity generation.

(3) In the vibration-driven energy harvesting element 1, the connecting members 25 are made of a material of a support layer as with the base part 2.

In such a configuration, the connecting members 25 having a strength on a par with a strength of the support layer can be provided.

(4) In the vibration-driven energy harvesting element 1 according to above (1) to (3), the fixed electrodes 3, the movable electrode 4, and the elastic support part 50 excluding the connecting members 25 are formed in an active layer of an SOI substrate that is provided with the active layer, a sacrificial layer, and the support layer, and the base part 2 and the connecting members 25 are formed in the support layer of the SOI substrate.

In such a configuration, the members are appropriately provided in the active layer or the support layer.

(5) In the vibration-driven energy harvesting element 1 in above (4), the connecting members 25 are fixed to the coupling portions 52 included in the plurality of elastic structures 5 via sacrificial layers 38.

In such a configuration, the connecting members 25 that are appropriately fixed to the coupling portions 52 of the plurality of elastic structures 5 can be provided.

(6) A method for manufacturing the vibration-driven energy harvesting element 1 described above includes a first process of preparing the SOI substrate provided with the active layer as a first layer, the sacrificial layer as a second layer, and the support layer as a third layer, a second process of partly etching the active layer from the active layer side of the SOI substrate to form the fixed electrodes 3, the movable electrode 4, and the elastic support part 50 excluding the connecting members 25, a third process of partly etching the support layer from the support layer side of the SOI substrate to form the base part 2 and the connecting members 25, and a fourth process of, after the second process and the third process are ended, partly etching the sacrificial layer to separate at least the fixed electrodes 3 from the connecting members 25.

In such a configuration, the connecting members 25 for reducing a strain that occurs in each coupling portion 52 to which the plurality of MEMS elastic structures 51a to 51d are fixed in the elastic structure 5 of the elastic support part 50 can be appropriately fixed to the coupling portions 52.

(7) In the method for manufacturing the vibration-driven energy harvesting element 1 in above (6), the coupling portions 52 of the plurality of elastic structures 5 and the connecting members 25 are formed integrally via the sacrificial layers 38 that are left in the fourth process.

In such a configuration, the connecting members 25 can be appropriately fixed to the coupling portions 52.

(8) In the method for manufacturing the vibration-driven energy harvesting element 1 in above (7), in the fourth process, the sacrificial layer is removed in a region where the active layer is removed in the second process, a region where the support layer is removed in the third process, and facing regions where the fixed electrodes 3 face the connecting members 25.

In such a configuration, the parts and portions can be appropriately formed.

(Modifications)

The substrate having the support layer of Si, the sacrificial layer of $SiO_2$, and the active layer of Si (the SOI substrate) is used as the substrate in the embodiment described above. However, the substrate is not limited to the SOI substrate. The substrate may be any substrate including the first layer as the active layer, the second layer as the sacrificial layer, and the third layer as the support layer that are stacked, the second layer having an etching resistance different from etching resistances of the first layer and the third layer. Of these layers, the second layer or the third layer may be a layer made of an insulating material.

As an example, the substrate may be a substrate in which a second layer of $SiO_2$ and a first layer of Si are formed on a third layer of sapphire. As another example, the substrate may be a substrate in which a second layer of a metal oxide and a first layer of a metal are formed on a third layer of a metal.

Further, the gas or the like used in the etching process described above is merely an example, and another type of gas may be used.

Various embodiments and modifications have been described above, but the present invention is not limited to these details. The numbers and the shapes of the various parts and portions in the embodiment are by way of example only and may be any other numbers and any other shapes.

The embodiments and the modifications may be each applied alone or may be used in combination.

Other aspects contemplated within the scope of the technical concept of the present invention are also included within the scope of the present invention.

REFERENCE SIGNS LIST

1 vibration-driven energy harvesting element, 2 base part, 3 fixed electrode, 4 movable electrode, 5 elastic structure, 6a, 6b fixing part, 20, 26, E region, 25 connecting member, 38 sacrificial layer, 50 elastic support part, 51a to 51d MEMS elastic structure, 52 coupling portion

The invention claimed is:

1. A vibration-driven energy harvesting element comprising:
   fixed electrodes that are fixed to a base part;
   a movable electrode that is movable with respect to the fixed electrodes; and
   an elastic support part that includes one end fixed to the base part and another end fixed to the movable electrode and elastically supports the movable electrode, wherein
   the elastic support part includes:
      a plurality of elastic structures each of which has a linking portion, a first elastic portion, and a second elastic portion, the first elastic portion having one end fixed to the linking portion and another end fixed to the movable electrode and extending in a second direction orthogonal to a first direction in which the movable electrode vibrates, the second elastic portion having one end fixed to the linking portion and another end fixed to the base part and extending in the second direction, the plurality of elastic structures being disposed on both sides of the movable electrode in the first direction; and
      connecting members that connect the linking portions included in the plurality of elastic structures to each other, and
      wherein the connecting members and the fixed electrodes intersect with each other as viewed from a third direction orthogonal to the first direction and the second direction and are separated from each other in the third direction.

2. The vibration-driven energy harvesting element according to claim 1, wherein the connecting members and the base part are formed from the same material layer during fabrication.

3. The vibration-driven energy harvesting element according to claim 2, wherein
   the fixed electrodes, the movable electrode, and the elastic support part excluding the connecting members are formed in a first layer of a substrate provided with the first layer, a second layer, and a third layer, and
   the base part and the connecting members are formed in the third layer of the substrate.

4. The vibration-driven energy harvesting element according to claim 3, wherein the connecting members are fixed to the linking portions included in the plurality of elastic structures via the second layer.

5. The vibration-driven energy harvesting element according to claim 1, wherein
   the fixed electrodes, the movable electrode, and the elastic support part excluding the connecting members are formed in a first layer of a substrate provided with the first layer, a second layer, and a third layer, and
   the base part and the connecting members are formed in the third layer of the substrate.

6. The vibration-driven energy harvesting element according to claim 5, wherein the connecting members are fixed to the linking portions included in the plurality of elastic structures via the second layer.

7. A method for manufacturing the vibration-driven energy harvesting element according to claim 1, the method comprising:
   a first process of preparing a substrate provided with a first layer, a second layer, and a third layer;
   a second process of partly etching the first layer from the first layer side of the substrate to form the fixed electrodes, the movable electrode, and the elastic support part excluding the connecting members;
   a third process of partly etching the third layer from the third layer side of the substrate to form the base part and the connecting members; and
   a fourth process of, after the second process and the third process are ended, partly etching the second layer to separate at least the fixed electrodes from the connecting members.

8. The method for manufacturing the vibration-driven energy harvesting element according to claim 7, wherein the linking portions of the plurality of elastic structures and the connecting members are formed integrally via the second layer that is left in the fourth process.

9. The method for manufacturing the vibration-driven energy harvesting element according to claim 8, wherein in the fourth process, the second layer is removed in a region where the first layer is removed in the second process, a region where the third layer is removed in the third process, and facing regions where the fixed electrodes face the connecting members.

* * * * *